United States Patent [19]
Champlin

[11] Patent Number: 6,037,777
[45] Date of Patent: Mar. 14, 2000

[54] METHOD AND APPARATUS FOR DETERMINING BATTERY PROPERTIES FROM COMPLEX IMPEDANCE/ADMITTANCE

[76] Inventor: Keith S. Champlin, 5437 Elliot Ave. South, Minneapolis, Minn. 55417

[21] Appl. No.: 09/151,324

[22] Filed: Sep. 11, 1998

[51] Int. Cl.$^7$ .................................................. G01N 27/416
[52] U.S. Cl. .............................. 324/430; 324/426; 702/63
[58] Field of Search ..................................... 324/426, 427, 324/430; 340/636; 702/63, 64, 65; 320/127, 116

[56] References Cited

U.S. PATENT DOCUMENTS

| | | | |
|---|---|---|---|
| 3,676,770 | 7/1972 | Sharaf et al. | 324/29.5 |
| 3,753,094 | 8/1973 | Furuishi et al. | 324/29.5 |
| 4,678,998 | 7/1987 | Muramatsu | 324/427 |
| 4,697,134 | 9/1987 | Burkum et al. | 320/134 |
| 4,743,855 | 5/1988 | Randin et al. | 324/430 |
| 5,047,722 | 9/1991 | Wurst et al. | 324/430 |
| 5,140,269 | 8/1992 | Champlin | 324/433 |
| 5,585,728 | 12/1996 | Champlin | 324/427 |
| 5,650,937 | 7/1997 | Bounaga | 702/65 |
| 5,773,978 | 6/1998 | Becker | 324/430 |

FOREIGN PATENT DOCUMENTS

WO 93/22666 11/1993 WIPO.

OTHER PUBLICATIONS

"Electrochemical Impedance Spectroscopy in Battery Development and Testing", *Batteries International*, Apr. 1997, pp. 59 and 62–63.

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

"A Look at the Impedance of a Cell", by S. Debardelaben, *IEEE*, 1988, pp. 394–397.

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

*Primary Examiner*—Diep N. Do
*Attorney, Agent, or Firm*—Westman, Champlin & Kelly, P.A.

[57] ABSTRACT

A device includes a microprocessor or microcontroller and measures real and imaginary parts of complex immittance of a cell or battery at n discrete frequencies, where n is an integer number equal to or greater than 2. The device determines cell/battery properties by evaluating components of an equivalent circuit model comprising 2n frequency-independent elements. Equating real and imaginary parts of measured immittance to values appropriate to the model at the n measurement frequencies defines a system of 2n nonlinear equations. Introducing 2n intermediate variables permits solving these equations and leads to values for the 2n model elements. A table of element values contains virtually the same information as the spectrum of complex immittance over a wide frequency range but provides this information in a more concise form that is easier to store, analyze, and manipulate. Thus, the 2n element values may themselves comprise the desired result. If desired, however, a predetermined relationship between one or more of the elements and an additional electrical, chemical, or physical property of the cell/battery may be further invoked to determine the additional property.

21 Claims, 3 Drawing Sheets

— Experiment
o o Spot-Frequency Measurements
- - Calculated from Fig. 3 Model

— Experiment
o o Spot-Frequency Measurements
- - Calculated from Fig. 3 Model

— Experiment
○○ Spot-Frequency Measurements
- - Calculated from Fig. 5 Model

— Experiment
○○ Spot-Frequency Measurements
- - Calculated from Fig. 5 Model

METHOD AND APPARATUS FOR DETERMINING BATTERY PROPERTIES FROM COMPLEX IMPEDANCE/ ADMITTANCE

BACKGROUND OF THE INVENTION

Small-signal ac measurement techniques have proven useful in determining properties of electrochemical cells and batteries such as cranking power, percent capacity, and state-of-health. These techniques have generally utilized single-frequency measurements of a single quantity, such as conductance (e.g., U.S. Pat. Nos. 5,585,728 and 5,140,269 to Champlin), resistance (e.g., U.S. Pat. No. 3,676,770 to Sharaf et al, U.S. Pat. No. 3,753,094 to Furuishi, U.S. Pat. No. 5,047,722 to Wurst et al), or "impedance" (e.g., U.S. Pat. No. 4,697,134 to Burkum et al, U.S. Pat. No. 5,773,978 to Becker). However, considerably more information of an electrical, chemical, and physical nature is contained in the continuous spectrum of complex immittance, i.e., either impedance or admittance, displayed over a range of frequencies. (See, e.g., David Robinson, "Electrochemical Impedance Spectroscopy in Battery Development and Testing", *BATTERIES INTERNATIONAL*, 31, pp. 59–63, April, 1997). A big challenge for field testing batteries is to acquire such information from a relatively small number of measurements obtained at a few selected "spot" frequencies.

Muramatsu discloses one approach to this challenge in U.S. Pat. No. 4,678,998. He measures impedance magnitude at two frequencies. At each frequency he compares the measured magnitude with that of a predetermined experimental relationship between impedance magnitude, remaining capacity, and remaining service life. He reports that such measurements can separately determine the battery's remaining capacity and its remaining service life. Randin discloses a second approach in U.S. Pat. No. 4,743,855. He reportedly determines a battery's state-of-discharge from the argument (i.e., phase angle) of the difference between complex impedances measured at two frequencies. Bounaga discloses still another approach in U.S. Pat. No. 5,650,937. He reportedly determines state-of-charge from measurements of only the imaginary part of complex impedance obtained at a single frequency. All three of these approaches have fairly limited objectives, however. Much more information is actually contained in the complete spectrum of complex immittance than is acquired by Muramatsu, Randin, or Bounaga.

Equivalent circuit modeling may assist one in relating complex immittance spectra to electrical, chemical, or physical properties of a battery. A complex nonlinear least-squares curve-fitting procedure has been used by electrochemists to relate impedance spectra to nonlinear electrochemical models. (See, e.g., J. Ross Macdonald and Donald R. Franceschetti, "Precision of Impedance Spectroscopy Estimates of Bulk, Reaction Rate, and Diffusion Parameters", *Journal of Electroanalytical Chemistry*, 307, pp. 1–11, 1991; see also Bernard A. Boukamp, "A Package for Impedance/Admittance Data Analysis", *Solid State Ionics*, 18, pp.136–140, 1986). This complex procedure, however, requires measuring the complete spectral distribution of cell/battery impedance and then making initial estimates of the model's parameters to ensure ultimate convergence.

An equivalent circuit model is an interconnection of electrical elements introduced to represent terminal characteristics of the battery. In a linear small-signal model, these elements comprise discrete resistances capacitances and inductances. Such models have been described by a number of workers including Hampson, et al (N. A. Hampson, et al, "The Impedance of Electrical Storage Cells", *Journal of Applied Electrochemistry*, 10, pp.3–11, 1980), Willihnganz and Rohner (E. Willihnganz and Peter Rohner, "Battery Impedance", *Electrical Engineering*, 78, No. 9, pp. 922–925, September, 1959), and DeBardelaben (S. DeBardelaben, "Determining the End of Battery Life", INTELLEC 86, *IEEE Publication* CH2328-3/86/0000-0365, pp. 365–386, 1986; and S. DeBardelaben, "A Look at the Impedance of a Cell", INTELLEC 88, *IEEE Publication* CH2653-4/88/000-0394, pp. 394–397, 1988). However, none of these workers has disclosed means for determining component values of an equivalent circuit model from a small number of measurements obtained at a few selected "spot" frequencies. That is an important contribution of the invention disclosed herein.

SUMMARY OF THE INVENTION

A device includes a microprocessor or microcontroller and measures real and imaginary parts of complex immittance of a cell or battery at n discrete frequencies, where n is an integer number equal to or greater than 2. The device determines cell/battery properties by evaluating components of an equivalent circuit model comprising 2n frequency-independent linear electrical elements. Equating measured real and imaginary parts of complex immittance to theoretical real and imaginary values appropriate to the model at each of the n discrete frequencies defines a set of 2n nonlinear equations in 2n unknowns. By introducing 2n intermediate variables, this formidable problem is made linear and is systematically solved for the values of the components of the model. Once these values are known, a table of the 2n element values contains virtually the same information as the continuous spectrum of complex immittance displayed over a range of frequencies. However, the table of values provides this information in a much more concise form that is easier to store, analyze, and manipulate. Thus, circuit element values may themselves comprise the desired result. Moreover, the circuit elements represent actual processes occurring within the battery. Accordingly, a predetermined relationship between one or more of the elements and an additional electrical, chemical, or physical property of the cell/battery may be invoked to determine the additional property.

The method and apparatus disclosed herein are efficient, accurate, and easily implemented with a microcontroller or microprocessor. The invention is suitable for a variety of diagnostic applications ranging from hand-held battery testers to "smart" battery chargers and battery "fuel gauges" in electric vehicles. Although a lead-acid automotive storage battery is used as an example to teach the method, the invention is equally applicable to both primary and secondary cells and batteries, and to those employed in a variety of other applications and/or employing other chemical systems.

DETAILED DESCRIPTION OF THE PREFERRED EMBODIMENT

The impedance of a cell or battery is a complex quantity. At a particular discrete or "spot" frequency $f_k$, the complex impedance can be written in terms of its real and imaginary parts as $$Z(f_k) = R(f_k) + jX(f_k) \quad (1)$$

where $j = \sqrt{-1}$. The real quantities $R(f_k)$ and $X(f_k)$ are, respectively, the resistance and the reactance of the cell/battery at the frequency $f_k$. They physically represent ratios of in-phase voltage amplitude to current amplitude, and quadrature voltage amplitude to current amplitude, respectively, at the frequency $f_k$.

The admittance of a cell or battery is likewise a complex quantity. At a particular discrete or "spot" frequency $f_k$, the complex admittance can be written $$Y(f_k) = G(f_k) + jB(f_k). \quad (2)$$

The real quantities $G(f_k)$ and $B(f_k)$ are, respectively, the conductance and the susceptance of the cell/battery at the frequency $f_k$. They physically represent ratios of in-phase current amplitude to voltage amplitude, and quadrature current amplitude to voltage amplitude, respectively, at the frequency $f_k$.

Complex admittance and complex impedance are related to each other by the reciprocal relationship $$Y(f_k) = 1/Z(f_k). \quad (3)$$

Accordingly, spectra of complex admittance and spectra of complex impedance contain exactly the same information about the cell or battery. The term "immittance" will herein denote either quantity in instances where the choice is immaterial.

Figure 1A:
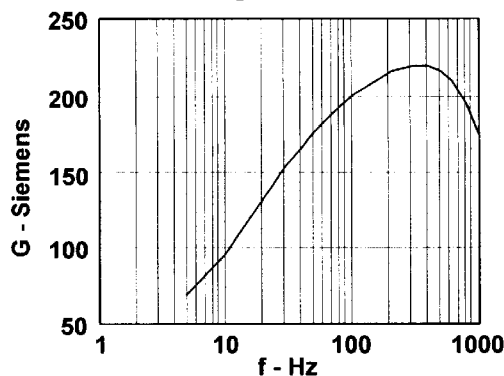
FIG. 1*a* is a spectral plot of measured real part of admittance of an actual 12-volt automotive storage battery.
Figure 1B:
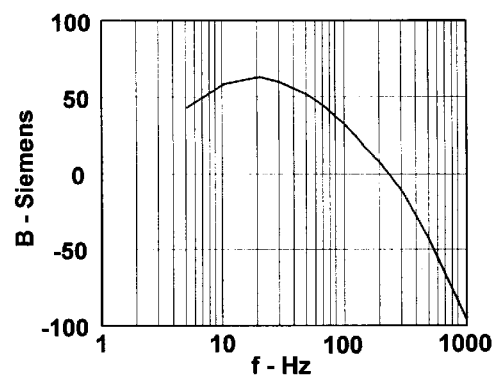
FIG. 1*b* is a spectral plot of measured imaginary part of admittance of an actual 12-volt automotive storage battery.

Measured spectra of real and imaginary parts of complex admittance of a typical automotive storage battery are disclosed in FIGS. 1a and 1b, respectively, over the frequency range from 5 Hz to 1000 Hz. Considerable information about a battery is expressed in such spectral plots. One sees from FIG. 1b, for example, that the battery passes through series resonance near 250 Hz, being capacitive (B>0) below this frequency and inductive (B<0) above. However, most of the battery information displayed in FIGS. 1a and 1b is very subtle, and not at all obvious from the plots.

Figure 2:
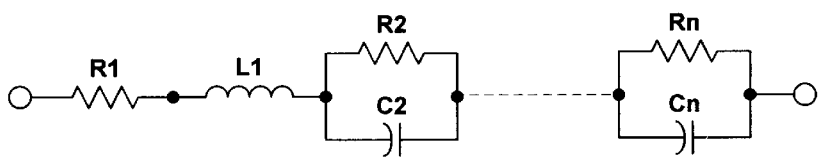
FIG. 2 depicts a general small-signal ac equivalent circuit model of a cell or battery comprising 2n frequency-independent linear elements.

FIG. 2 discloses a small-signal ac equivalent circuit model introduced herein to assist in reducing spectral plots of complex immittance, such as those displayed in FIGS. 1a and 1b, to a small set of frequency-independent parameters. One sees that the model of FIG. 2 comprises a series interconnection of a single two-element series R-L subcircuit and n−1 two-element parallel R-C subcircuits. For n=2, this general equivalent circuit model reduces to the simple model discussed by both Willihnganz and Rohner and by DeBardelaben.

A complete disclosure of my method for determining circuit-model element values from measured values of spot-frequency complex immittance follows. I begin with an expression for the complex impedance of the model of FIG. 2

$$Z = R + jX = R1 + j\omega L1 + \frac{1}{1/R2 + j\omega C2} + \ldots + \frac{1}{1/Rn + j\omega Cn} \quad (4)$$

where $\omega = 2\pi f$ is the angular frequency. The inductance and the capacitances are eliminated from this expression by writing them in terms of time constants $$\tau_1 = L1/R1 \quad (5)$$
$$\tau_2 = R2C2$$
$$\vdots \quad \vdots$$
$$\tau_n = RnCn$$

The result is $$Z = R + jX = R1(1 + j\omega\tau_1) + \frac{R2}{(1 + j\omega\tau_2)} + \ldots + \frac{Rn}{(1 + j\omega\tau_n)}. \quad (6)$$

Multiplying both sides of equation (6) by the product $(1+j\omega\tau_2) \ldots (1+j\omega\tau_n)$ clears the fractions and yields $$(R+jX)(1+j\omega\tau_2)\ldots(1+j\omega\tau_n) = R1(1+j\omega\tau_1)\ldots(1+j\omega\tau_n) + R2(1+j\omega\tau_3)\ldots(1+j\omega\tau_n) + \ldots + Rn(1+j\omega\tau_2)\ldots(1+j\omega\tau_{n-1}). \quad (7)$$

For n=3, equation (7) reduces to $$(R+jX)(1+j\omega\tau_2)(1+j\omega\tau_3) = R1(1+j\omega\tau_1)(1+j\omega\tau_2)(1+j\omega\tau_3) + R2(1+j\omega\tau_3) + R3(1+j\omega\tau_2). \quad (8)$$

Equation (7) is divided into two equations by multiplying the terms out, separating them into real and imaginary parts, and then separately equating real to real, and imaginary to imaginary. For n=3, this procedure leads to Real Part:

$$(\omega^2 R)(\tau_2\tau_3) + (\omega X)(\tau_2+\tau_3) - \omega^2\{R1(\tau_2\tau_3+\tau_3\tau_1+\tau_1\tau_2)\} + (R1+R2+R3) = R \quad (9)$$

Imaginary Part:

$$(\omega^2 X)(\tau_2\tau_3) - (\omega R)(\tau_2+\tau_3) + \omega\{R1(\tau_1+\tau_2+\tau_3) + R2\tau_3 + R3\tau_2\} - \omega^3\{R1(\tau_1\tau_2\tau_3)\} = X \quad (10)$$

Equations (9) and (10) are nonlinear since the 2n unknown resistances and time constants appear as combinations of products. I attack this formidable problem by defining a new set of 2n intermediate variables. These new variables are the various combinations of the model's resistances and time constants that multiply functions of battery resistance, battery reactance, and frequency. For n=3, the six intermediate variables are defined by $$\Psi_1 \equiv (\tau_2 + \tau_3) \tag{11a}$$

$$\Psi_2 \equiv (\tau_2 \tau_3) \tag{11b}$$

$$\Psi_3 \equiv (R1 + R2 + R3) \tag{11c}$$

$$\Psi_4 \equiv (\tau_1 + \tau_2 + \tau_3)R1 + \tau_3 R2 + \tau_2 R3 \tag{11d}$$

$$\Psi_5 \equiv (\tau_2 \tau_3 + \tau_3 \tau_1 + \tau_1 \tau_2)R1 \tag{11e}$$

$$\Psi_6 \equiv (\tau_1 \tau_2 \tau_3)R1 \tag{11f}$$

When expressed in terms of these new variables, equations (9) and (10) are linear. At the angular spot frequency $\omega_k$, these two equations are $$\{\omega_k X(\omega_k)\}\Psi_1 + \{\omega_k^2 R(\omega_k)\}\Psi_2 + \{1\}\Psi_3 + \{0\}\Psi_4 - \{\omega_k^2\}\Psi_5 + \{0\}\Psi_6 = R(\omega_k) \tag{12}$$

and $$-\{\omega_k R(\omega_k)\}\Psi_1 + \{\omega_k^2 X(\omega_k)\}\Psi_2 + \{0\}\Psi_3 + \{\omega_k\}\Psi_4 + \{0\}\Psi_5 - \{\omega_k^3\}\Psi_6 = X(\omega_k) \tag{13}$$

In general, equations such as (12) and (13) comprise a pair of linear inhomogeneous equations for the 2n intermediate variables, $\Psi_1, \ldots, \Psi_{2n}$. Even though linear, such equations are still not solvable since they contain an insufficient number of relationships between variables. However, by evaluating the complex impedance at n discrete frequencies, $\omega_1 \ldots \omega_n$, the two equations expand into a solvable set of 2n linear inhomogeneous equations in 2n unknowns. Such a system can be solved by the well-known method known as Cramer's rule. Cramer's rule expresses the 2n solutions, $\Psi_1, \ldots, \Psi_{2n}$, as ratios of determinants having 2n columns and 2n rows. For n=3, these six solutions are of the form $$\Psi_1 = A_1/A_D; \ldots; \Psi_6 = A_6/A_D \tag{14}$$

where $A_D$ and $A_1 \ldots A_6$ are (6×6) determinants given by $$A_D = \begin{vmatrix} \omega_1 X(\omega_1) & \omega_1^2 R(\omega_1) & 1 & 0 & -\omega_1^2 & 0 \\ \omega_2 X(\omega_2) & \omega_2^2 R(\omega_2) & 1 & 0 & -\omega_2^2 & 0 \\ \omega_3 X(\omega_3) & \omega_3^2 R(\omega_3) & 1 & 0 & -\omega_3^2 & 0 \\ -\omega_1 R(\omega_1) & \omega_1^2 X(\omega_1) & 0 & \omega_1 & 0 & -\omega_1^3 \\ -\omega_2 R(\omega_2) & \omega_2^2 X(\omega_2) & 0 & \omega_2 & 0 & -\omega_2^3 \\ -\omega_3 R(\omega_3) & \omega_3^2 X(\omega_3) & 0 & \omega_3 & 0 & -\omega_3^3 \end{vmatrix} \tag{15}$$

$$A_1 = \begin{vmatrix} R(\omega_1) & \omega_1^2 R(\omega_1) & 1 & 0 & -\omega_1^2 & 0 \\ R(\omega_2) & \omega_2^2 R(\omega_2) & 1 & 0 & -\omega_2^2 & 0 \\ R(\omega_3) & \omega_3^2 R(\omega_3) & 1 & 0 & -\omega_3^2 & 0 \\ X(\omega_1) & \omega_1^2 X(\omega_1) & 0 & \omega_1 & 0 & -\omega_1^3 \\ X(\omega_2) & \omega_2^2 X(\omega_2) & 0 & \omega_2 & 0 & -\omega_2^3 \\ X(\omega_3) & \omega_3^2 X(\omega_3) & 0 & \omega_3 & 0 & -\omega_3^3 \end{vmatrix} \tag{16}$$

$$A_2 = \begin{vmatrix} \omega_1 X(\omega_1) & R(\omega_1) & 1 & 0 & -\omega_1^2 & 0 \\ \omega_2 X(\omega_2) & R(\omega_2) & 1 & 0 & -\omega_2^2 & 0 \\ \omega_3 X(\omega_3) & R(\omega_3) & 1 & 0 & -\omega_3^2 & 0 \\ -\omega_1 R(\omega_1) & X(\omega_1) & 0 & \omega_1 & 0 & -\omega_1^3 \\ -\omega_2 R(\omega_2) & X(\omega_2) & 0 & \omega_2 & 0 & -\omega_2^3 \\ -\omega_3 R(\omega_3) & X(\omega_3) & 0 & \omega_3 & 0 & -\omega_3^3 \end{vmatrix} \tag{17}$$

$$A_3 = \begin{vmatrix} \omega_1 X(\omega_1) & \omega_1^2 R(\omega_1) & R(\omega_1) & 0 & -\omega_1^2 & 0 \\ \omega_2 X(\omega_2) & \omega_2^2 R(\omega_2) & R(\omega_2) & 0 & -\omega_2^2 & 0 \\ \omega_3 X(\omega_3) & \omega_3^2 R(\omega_3) & R(\omega_3) & 0 & -\omega_3^2 & 0 \\ -\omega_1 R(\omega_1) & \omega_1^2 X(\omega_1) & X(\omega_1) & \omega_1 & 0 & -\omega_1^3 \\ -\omega_2 R(\omega_2) & \omega_2^2 X(\omega_2) & X(\omega_2) & \omega_2 & 0 & -\omega_2^3 \\ -\omega_3 R(\omega_3) & \omega_3^2 X(\omega_3) & X(\omega_3) & \omega_3 & 0 & -\omega_3^3 \end{vmatrix} \tag{18}$$

$$A_4 = \begin{vmatrix} \omega_1 X(\omega_1) & \omega_1^2 R(\omega_1) & 1 & R(\omega_1) & -\omega_1^2 & 0 \\ \omega_2 X(\omega_2) & \omega_2^2 R(\omega_2) & 1 & R(\omega_2) & -\omega_2^2 & 0 \\ \omega_3 X(\omega_3) & \omega_3^2 R(\omega_3) & 1 & R(\omega_3) & -\omega_3^2 & 0 \\ -\omega_1 R(\omega_1) & \omega_1^2 X(\omega_1) & 0 & X(\omega_1) & 0 & -\omega_1^3 \\ -\omega_2 R(\omega_2) & \omega_2^2 X(\omega_2) & 0 & X(\omega_2) & 0 & -\omega_2^3 \\ -\omega_3 R(\omega_3) & \omega_3^2 X(\omega_3) & 0 & X(\omega_3) & 0 & -\omega_3^3 \end{vmatrix} \tag{19}$$

$$A_5 = \begin{vmatrix} \omega_1 X(\omega_1) & \omega_1^2 R(\omega_1) & 1 & 0 & R(\omega_1) & 0 \\ \omega_2 X(\omega_2) & \omega_2^2 R(\omega_2) & 1 & 0 & R(\omega_2) & 0 \\ \omega_3 X(\omega_3) & \omega_3^2 R(\omega_3) & 1 & 0 & R(\omega_3) & 0 \\ -\omega_1 R(\omega_1) & \omega_1^2 X(\omega_1) & 0 & \omega_1 & X(\omega_1) & -\omega_1^3 \\ -\omega_2 R(\omega_2) & \omega_2^2 X(\omega_2) & 0 & \omega_2 & X(\omega_2) & -\omega_2^3 \\ -\omega_3 R(\omega_3) & \omega_3^2 X(\omega_3) & 0 & \omega_3 & X(\omega_3) & -\omega_3^3 \end{vmatrix} \tag{20}$$

and $$A_6 = \begin{vmatrix} \omega_1 X(\omega_1) & \omega_1^2 R(\omega_1) & 1 & 0 & -\omega_1^2 & R(\omega_1) \\ \omega_2 X(\omega_2) & \omega_2^2 R(\omega_2) & 1 & 0 & -\omega_2^2 & R(\omega_2) \\ \omega_3 X(\omega_3) & \omega_3^2 R(\omega_3) & 1 & 0 & -\omega_3^2 & R(\omega_3) \\ -\omega_1 R(\omega_1) & \omega_1^2 X(\omega_1) & 0 & \omega_1 & 0 & X(\omega_1) \\ -\omega_2 R(\omega_2) & \omega_2^2 X(\omega_2) & 0 & \omega_2 & 0 & X(\omega_2) \\ -\omega_3 R(\omega_3) & \omega_3^2 X(\omega_3) & 0 & \omega_3 & 0 & X(\omega_3) \end{vmatrix}. \tag{21}$$

The determinants disclosed in equations (15)–(21) can be systematically evaluated from spot-frequency immittance measurements by well-known numerical expansion techniques. Once their values are known, the intermediate variables $\Psi_1, \ldots, \Psi_6$ follow from equations (14). The defining equations of the intermediate variables, equations (11a)–(11f), are then combined in particular ways to evaluate the elements of the equivalent circuit model.

The technique proceeds as follows. One first combines the defining equations for n−1 of the 2n intermediate variables to yield an equation for the n−1 capacitive time constants $\tau_2, \ldots, \tau_n$. These n−1 equations are identified by not containing resistances. For example, for n=3, I combine equation (11a) and equation (11b) to obtain the following quadratic equation:

$$\tau_{2,3}^2 - \Psi_1 \tau_{2,3} + \Psi_2 = 0. \tag{22}$$

The two roots of equation (22) are given by the well-known quadratic formula $$\tau_{2,3} = \frac{\Psi_1}{2} \pm \sqrt{(\Psi_1/2)^2 - \Psi_2}. \quad (23)$$

For the general case of arbitrary n, combining the n−1 defining equations that contain no resistances leads to the following polynomial equation of order n−1:

$$\tau^{(n-1)} - \Psi_1 \tau^{(n-2)} + \ldots \pm \Psi_{n-1} = 0. \quad (24)$$

The n−1 roots of equation (24) are the capacitive time constants $\tau_2, \ldots, \tau_n$. Although general formulas similar to equation (23) do not exist to solve higher order polynomial equations, the roots of equation (24) can always be found using well-known numerical root-finding algorithms.

Once the capacitive time constants have been determined, the inductive time constant $\tau_1$ follows by eliminating R1 from the two defining equations for intermediate variables that are proportional to R1. For example, with n=3, I combine equations (11e) and (11f) to obtain $$\tau_1 = \{(\Psi_5/\Psi_6) - 1/\tau_2 - 1/\tau_3\}^{-1}. \quad (25)$$

For the general case of arbitrary n, the expression for $\tau_1$ is of the form $$\tau_1 = \{(\Psi_{(2n-1)}/\Psi_{2n}) - 1/\tau_2 - \ldots - 1/\tau_n\}^{-1}. \quad (26)$$

Thus, in principle, all n time constants are known.

In general, there are 2n equations defining the 2n intermediate variables. The first n−1 of these equations contain no resistances and are employed to determine the capacitive time constants. Two of the remaining n+1 equations are employed to determine the inductive time constant. By choosing either one of these two equations, along with all of the remaining n−1 unused equations, one obtains a set of n linear inhomogeneous equations in the n unknowns R1, ..., Rn. Cramer's rule can then be invoked to solve this system for the values of these n resistances. For example, with n=3, I use equations (16c), (16d), and (16f) to obtain the following set of three linear equations in three unknowns:

$$\begin{aligned} \{1\}R1 &+ \{1\}R2 + \{1\}R3 = \Psi_3 \\ \{\tau_1 + \tau_2 + \tau_3\}R1 &+ \{\tau_3\}R2 + \{\tau_2\}R3 = \Psi_4 \\ \{\tau_1\tau_2\tau_3\}R1 &+ \{0\}R2 + \{0\}R3 = \Psi_6 \end{aligned} \quad (27)$$

Cramer's rule yields the following three solutions:

$$R1 = \frac{\begin{vmatrix} \Psi_3 & 1 & 1 \\ \Psi_4 & \tau_3 & \tau_2 \\ \Psi_6 & 0 & 0 \end{vmatrix}}{\begin{vmatrix} 1 & 1 & 1 \\ \tau_1 + \tau_2 + \tau_3 & \tau_3 & \tau_2 \\ \tau_1\tau_2\tau_3 & 0 & 0 \end{vmatrix}} \quad (28)$$

$$R2 = \frac{\begin{vmatrix} 1 & \Psi_3 & 1 \\ \tau_1 + \tau_2 + \tau_3 & \Psi_4 & \tau_2 \\ \tau_1\tau_2\tau_3 & \Psi_6 & 0 \end{vmatrix}}{\begin{vmatrix} 1 & 1 & 1 \\ \tau_1 + \tau_2 + \tau_3 & \tau_3 & \tau_2 \\ \tau_1\tau_2\tau_3 & 0 & 0 \end{vmatrix}} \quad (29)$$

and $$R3 = \frac{\begin{vmatrix} 1 & 1 & \Psi_3 \\ \tau_1 + \tau_2 + \tau_3 & \tau_3 & \Psi_4 \\ \tau_1\tau_2\tau_3 & 0 & \Psi_6 \end{vmatrix}}{\begin{vmatrix} 1 & 1 & 1 \\ \tau_1 + \tau_2 + \tau_3 & \tau_3 & \tau_2 \\ \tau_1\tau_2\tau_3 & 0 & 0 \end{vmatrix}}. \quad (30)$$

Thus, in principle, all n resistance values are known.

Finally, I invert equations (5) to determine the single inductance value and the n−1 capacitance values from the n known time constants and the n known resistance values $$L1 = \tau_1 R1 \quad (31a)$$
$$C2 = \tau_2/R2 \quad (31b)$$
$$\vdots \quad \vdots$$
$$Cn = \tau_n/Rn \quad (31c)$$

This completes the disclosure of my method for determining the 2n element values. Although n is unrestricted in principle, the problem of expanding large determinants will probably limit n to the range $2 \leq n \leq 8$. In summary, the steps are:

1. One first finds 2n intermediate variables by evaluating 2n ratios of determinants comprising 2n columns and 2n rows. The determinants comprise sums and differences of products combining the n spot frequencies with real and imaginary parts of impedance or admittance at the n spot frequencies.
2. The n−1 capacitive time constants are found as roots of a polynomial equation of order n−1. The polynomial's coefficients comprise n−1 of the 2n intermediate variables whose defining equations contain no resistances.
3. The inductive time constant is determined from an equation containing the capacitive time constants found in step 2 along with the ratio of the two intermediate variables proportional to R1.
4. The n resistances are determined by evaluating n ratios of (n×n) determinants. Elements of these determinants contain the n time constants found in steps 2 and 3 along with n of the remaining n+1 intermediate variables not employed in step 2.
5. Finally, the one inductance and the n−1 capacitances are evaluated by combining each of the n resistances with a corresponding time constant.

In practice, this procedure is readily implemented in software.

The exact procedure disclosed above can be simplified by choosing one of the n spot frequencies, say $\omega_n$, to be sufficiently high that the impedance of the series chain of R-C subcircuits is negligibly small at this frequency. A preliminary measurement of $Z(\omega_n)$ then gives approximations to R1 and L1 directly. Subtracting $R1 + j\omega_k L1$ from the total measured impedance $Z(\omega_k)$ at each of the n−1 remaining spot frequencies and equating this result to the theoretical impedance of the R-C subcircuit chain at each frequency leads to a system of 2n−2 equations in 2n−2 unknowns. Solving for the appropriate 2n−2 intermediate variables by Cramer's rule involves evaluating determinants that are fewer in number and smaller in size than the determinants evaluated in the exact procedure disclosed above.

Figure 3:
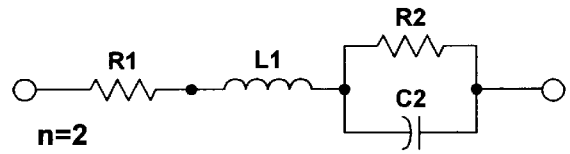
FIG. 3 depicts the equivalent circuit model of FIG. 2 with n=2.

FIG. 3 discloses an equivalent circuit model derived from FIG. 2 by letting n=2. This simple model is essentially the one discussed by Willihnganz and Rohner and by DeBardelaben in the publications cited earlier. By using the exact procedure disclosed above, I evaluated the four linear circuit elements of the model of FIG. 3 from the experimental data disclosed in FIGS. 1a and 1b at the two spot frequencies $f_1=5$ Hz and $f_2=1000$ Hz. The results of this evaluation procedure are displayed in Table 1.

TABLE 1

Model Element Values for n = 2

| | |
|---|---|
| R1 = 4.388 mΩ | R2 = 12.987 mΩ |
| L1 = 0.3885 μH | C2 = 2.602 F |

Figure 4A:
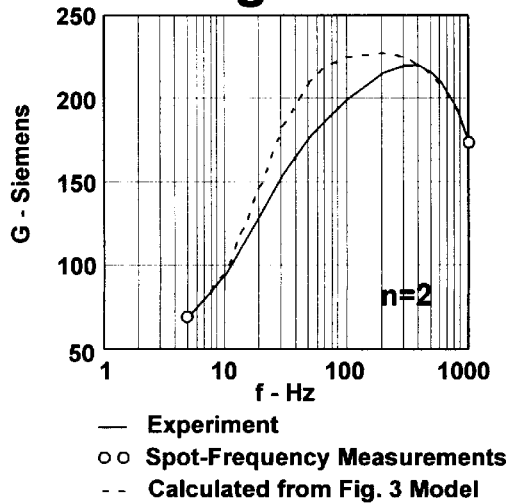
FIG. 4a is a plot of the experimental data of FIG. 1a compared with a theoretical curve calculated from the model of FIG. 3.
Figure 4B:
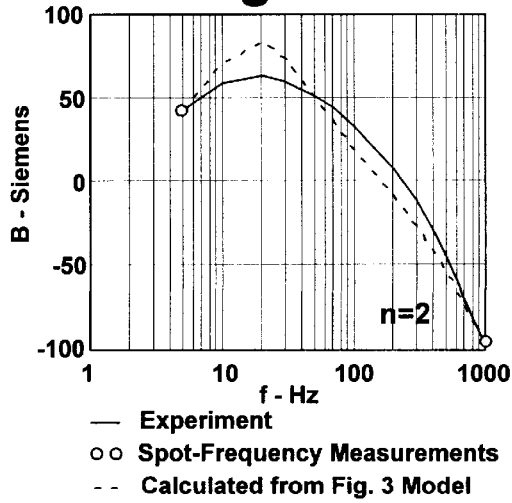
FIG. 4b is a plot of the experimental data of FIG. 1b compared with a theoretical curve calculated from the model of FIG. 3.

Theoretical curves of the real and imaginary parts of admittance as functions of frequency were calculated for the model of FIG. 3 by assuming the element values displayed in Table 1. The theoretical curves are plotted along with the measured curves for comparison in FIGS. 4a and 4b. One sees that the experimental and theoretical curves agree exactly at the two spot frequencies as would be anticipated. However, away from the spot frequencies the agreement is seen to be poor. This indicates that the model of FIG. 3 does not adequately represent the battery over this frequency range.

Figure 5:
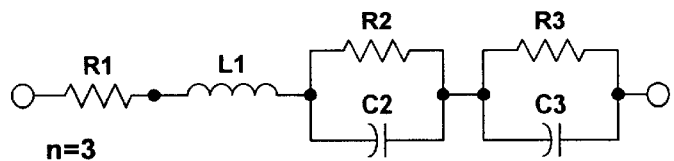
FIG. 5 depicts the equivalent circuit model of FIG. 2 with n=3.

Much better agreement is obtained with the n=3 model depicted in FIG. 5. Using the exact procedures disclosed above, I evaluated the six linear circuit elements of the model of FIG. 5 from the experimental data disclosed in FIGS. 1a and 1b at the three spot frequencies $f_1=5$ Hz, $f_2=70$ Hz, and $f_3=1000$ Hz. The results are displayed in Table 2.

TABLE 2

Model Element Values for n = 3

| | |
|---|---|
| R1 = 4.381 mΩ | R2 = 1.227 mΩ R3 = 13.257 mΩ |
| L1 = 0.411 μH | C2 = 1.812 F C3 = 3.14 F |

Figure 6A:
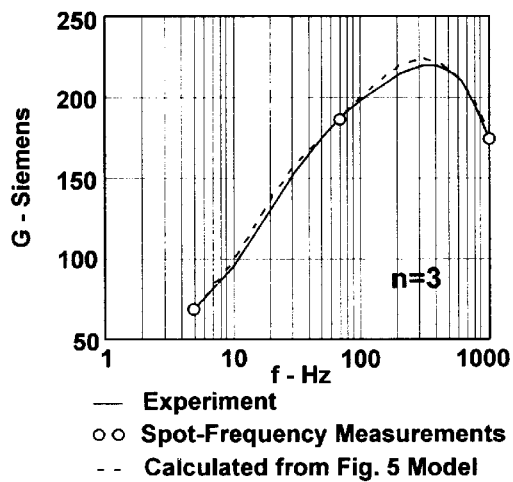
FIG. 6a is a plot of the experimental data of FIG. 1a compared with a theoretical curve calculated from the model of FIG. 5.
Figure 6B:
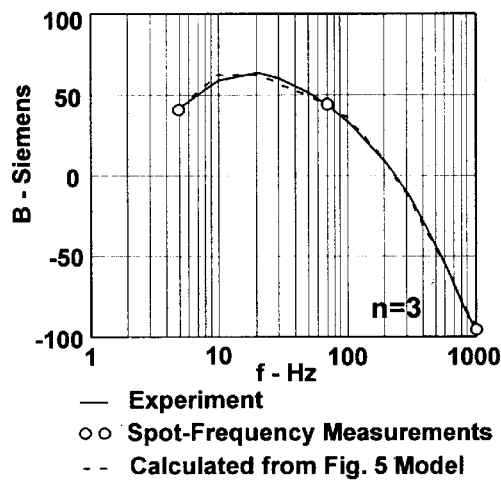
FIG. 6b is a plot of the experimental data of FIG. 1b compared with a theoretical curve calculated from the model of FIG. 5.

Theoretical curves of the real and imaginary parts of admittance as functions of frequency were calculated for the model of FIG. 5 by assuming the element values displayed in Table 2. These curves are plotted along with the measured curves for comparison in FIGS. 6a and 6b. Once again one sees that the experimental and theoretical curves agree exactly at the spot frequencies. Away from these frequencies, however, the agreement is seen to also be very good. Such good agreement proves the model of FIG. 5 to be an excellent representation of the battery over the frequency range from 5 Hz to 1000 Hz. Accordingly, the n=3 model much more closely describes actual processes within the battery than does the n=2 model.

The excellent agreement between the experimental curves and the theoretical predictions of the model means that Table 2 contains virtually the same information about the battery as does the continuous spectrum of complex admittance displayed in FIGS. 1a and 1b. However, Table 2 provides this information in a much more concise form that is far easier to store, analyze, and manipulate. Accordingly, the information displayed in Table 2 may itself comprise the desired result.

Moreover, since the circuit elements defined in the extended model closely describe actual processes occurring within the battery, a predetermined relationship can additionally be invoked if desired, to implement a final step of determining one or more additional battery property. For example, I have found that the battery's cold-cranking ampere (CCA) capacity is quite accurately given by $$CCA = 2662/R1 \qquad (32)$$

where R1 is expressed in milliohms. Thus, the battery whose complex admittance spectrum is disclosed in FIGS. 1a and 1b is capable of supplying 608 cold-cranking amperes. This important information is not at all obvious from the spectral plots of FIGS. 1a and 1b. Other electrical properties such as state-of-charge and ampere-hour capacity; chemical properties such as ion concentration and plate composition; and physical properties such as battery temperature and effective plate area, find similar expression in the complex immittance spectra of the battery and may be determined in a comparable manner.

Figure 7:
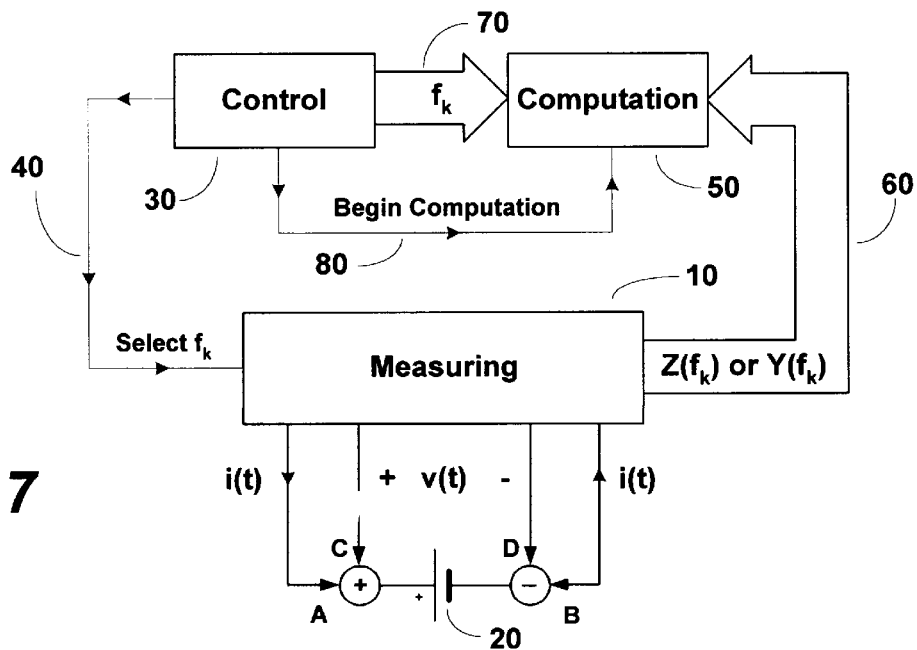
FIG. 7 is a block diagram of a device for determining battery properties from spot-frequency complex immittance according to the present invention.

FIG. 7 discloses a block diagram of a device for determining cell/battery properties from spot-frequency complex immittance according to the present invention. Measuring circuitry 10 electrically couples to cell/battery 20 by means of current-carrying contacts A and B and voltage-sensing contacts C and D. Measuring circuitry 10 passes a periodic time-varying current i(t) through contacts A and B and senses a periodic time-varying voltage v(t) across contacts C and D. By appropriately processing and combining i(t) and v(t), measuring circuitry 10 determines real and imaginary parts of complex immittance at a measuring frequency $f_k$; where $f_k$ is a discrete frequency component of waveforms i(t) and v(t).

Control circuitry 30 couples to measuring circuitry 10 via command path 40 and commands measuring circuitry 10 to determine the complex immittance of cell/battery 20 at each one of n discrete measuring frequencies, where n is an integer number equal to or greater than 2. This action defines 3n experimental quantities: the values of the n measuring frequencies and the values of the n imaginary and n real parts of the complex immittance at the n measuring frequencies.

Computation circuitry 50 couples to measuring circuitry 10 and to control circuitry 30 via data paths 60 and 70, respectively, and accepts the 2n experimental values from measuring circuitry 10 and the values of the n measuring frequencies from control circuitry 30. Upon a "Begin Computation" command from control circuitry 30 via command path 80, computation circuitry 50 invokes the procedure disclosed above to combine these 3n quantities numerically to evaluate the 2n elements of the equivalent circuit model. These 2n element values may themselves comprise the desired result. However, if desired, computation circuitry 50 can also perform an additional step by relating one or more of the model element values to an additional cell/battery property to determine the additional property.

In practice, a single microprocessor or microcontroller running an appropriate software program can perform the functions of both control circuitry 30 and computation circuitry 50 as well as much of the function of measuring circuitry 10. Microprocessor controlled impedance measuring apparatus is disclosed in a copending U.S. patent application.

Figure 8:
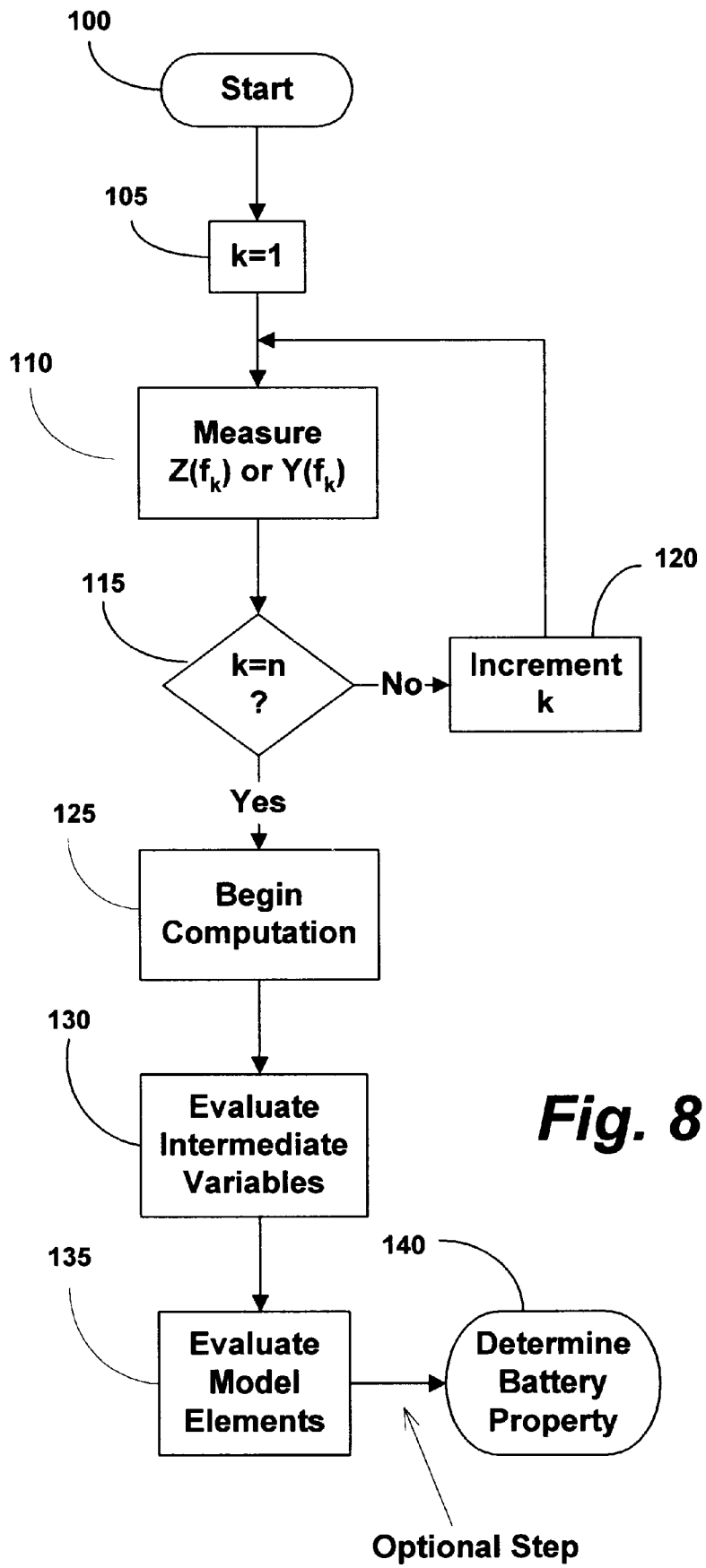
FIG. 8 is a flow chart depicting the control algorithm for the invention embodiment disclosed in FIG. 7.

FIG. 8 discloses a flow chart depicting a control algorithm for the invention embodiment of FIG. 7. Upon entering the procedure at 100, control circuitry 30 initializes a counter at 105 used to identify each spot frequency $f_k$. At 110, control circuitry 30 commands measuring circuitry 10 to excite the cell/battery with a periodic signal having a sinusoidal component at frequency $f_k$ and to determine the real and imaginary parts of complex immittance at this frequency. At decision block 115, control circuitry 30 determines whether this procedure has been performed at all of the desired spot frequencies. If the answer is no, the counter is incremented at 120 and the procedure repeated at a new frequency. If yes, control circuitry 30 commands computation circuitry 50 to begin the computation at 125. Computation circuitry 50 begins at step 130 by determining the 2n intermediate variables from the values of real and imaginary parts of complex immittance at the n spot frequencies along with the n spot frequency values themselves. The 2n frequency-independent model elements are then evaluated from the 2n intermediate variable values at step 135. Finally, at optional step 140 computation circuitry 50 can, if desired, invoke an additional predetermined relationship between one or more of the model elements and a desired cell/battery property to determine the desired property.

This completes the disclosure of my invention. The method and apparatus are efficient, accurate, and easily implemented with a microcontroller or microprocessor. The invention is quite general and suitable for a wide variety of diagnostic applications ranging from hand-held battery test instruments to "smart" battery chargers and battery "fuel gauges" in electric vehicles. Although a lead-acid storage battery was used as an example to teach the method, the disclosed invention is equally applicable to both primary and secondary cells and batteries, and to cells/batteries employed in a variety of other applications and/or employing other chemical systems.

The present invention has been described with reference to a preferred embodiment. However, workers skilled in the art will recognize that changes may be made in form and detail without departing from the spirit and scope of the invention.

What is claimed is:

1. A device for determining values of at least one of 2n elements comprising an equivalent circuit model of an electrochemical cell or battery where n is an integer equal to or greater than two, said device comprising:

measuring circuitry adapted to couple to said cell or battery and adapted to pass a periodic current through said cell or battery, to sense a periodic voltage across said cell or battery, and to determine a real part and an imaginary part of complex immittance of said cell or battery at a measurement frequency comprising a component frequency of said periodic current and said periodic voltage;

control circuitry coupled to said measuring circuitry and adapted to command said measuring circuitry to select each one of n said measurement frequencies thereby defining n said real parts, n said imaginary parts and n said measurement frequencies; and, computation circuitry coupled to said measuring circuitry and to said control circuitry and adapted to numerically combine values of said n real parts, said n imaginary parts, and said n measurement frequencies to determine said values of at least one of said 2n elements comprising said equivalent circuit model of said electrochemical cell or battery.

2. A device as in claim 1 wherein n is equal to three.

3. A device as in claim 1 wherein said control circuitry and said computation circuitry comprise a microprocessor or microcontroller running a software program adapted to select each one of said n measurement frequencies and to numerically combine values of said n real parts, said n imaginary parts, and said n measurement frequencies to determine said values of at least one of said 2n elements comprising said equivalent circuit model of said electrochemical cell or battery.

4. A device as in claim 3 wherein said software program is further adapted to numerically combine values of said n real parts, said n imaginary parts, and said n measurement frequencies to evaluate 2n intermediate variables, and said values at least one of said 2n elements are determined from values of said 2n intermediate variables.

5. A device for determining an electrical, chemical, or physical property of an electrochemical cell or battery comprising:

measuring circuitry adapted to couple to said cell or battery and adapted to pass a periodic current through said cell or battery, to sense a periodic voltage across said cell or battery, and to determine a real part and an imaginary part of complex immittance of said cell or battery at a measurement frequency comprising a component frequency of said periodic current and said periodic voltage;

control circuitry coupled to said measuring circuitry and adapted to command said measuring circuitry to select each one of n said measurement frequencies thereby defining n said real parts, n said imaginary parts and n said measurement frequencies where n is an integer number equal to or greater than two; and, computation circuitry coupled to said measuring circuitry and to said control circuitry and adapted to numerically combine values of said n real parts, said n imaginary parts, and said n measurement frequencies to determine said electrical, chemical, or physical property of said electrochemical cell or battery.

6. A device as in claim 5 wherein n is equal to three.

7. A device as in claim 5 wherein said control circuitry and said computation circuitry comprise a microprocessor or microcontroller running a software program adapted to select each one of said n measurement frequencies and to numerically combine values of said n real parts, said n imaginary parts, and said n measurement frequencies to determine said electrical, chemical, or physical property of said electrochemical cell or battery.

8. A device as in claim 7 wherein said software program is further adapted to numerically combine values of said n real parts, said n imaginary parts, and said n measurement frequencies to evaluate 2n intermediate variables, and said electrical, chemical, or physical property of said electrochemical cell or battery is determined from values of said 2n intermediate variables.

9. A device as in claim 8 wherein said software program is further adapted to numerically combine said 2n intermediate variables to evaluate circuit model elements and said electrical, chemical, or physical property of said electrochemical cell or battery is determined from values of said circuit model elements.

10. A method for determining an electrical, chemical, or physical property of an electrochemical cell or battery comprising the steps of:

measuring real and imaginary parts of complex immittance of said electrochemical cell or battery at n discrete frequencies where n is an integer number equal to or greater than two;

evaluating 2n intermediate variables by numerically combining values of said n discrete frequencies and values of said real and imaginary parts of said complex immittance at said n discrete frequencies;

evaluating n−1 capacitive time constants by numerically combining values of n−1 of said 2n intermediate variables;

evaluating an inductive time constant by numerically combining values of said n−1 capacitive time constants and values of two of said 2n intermediate variables;

evaluating n resistive elements by numerically combining values of said n–1 capacitive time constants, the value of said inductive time constant, and values of n of said 2n intermediate variables;

evaluating n reactive elements by numerically combining each value of said n resistive elements with a corresponding value of one of said n–1 capacitive time constants and said inductive time constant; and relating values of one or more of said resistive elements and said reactive elements to said electrical, chemical, or physical property of said electrochemical cell or battery.

11. A method as in claim 10 wherein n is equal to three.

12. A method for determining element values of an equivalent circuit model of an electrochemical cell or battery, said model comprising a series interconnection of a single two-element series R-L subcircuit and n–1 two-element parallel R-C subcircuits where n is an integer number equal to or greater than two, said method comprising the steps of:

measuring real and imaginary parts of complex immittance of said electrochemical cell or battery at n discrete frequencies;

evaluating 2n intermediate variables by numerically combining values of said n discrete frequencies and values of said real and imaginary parts of said complex immittance at said n discrete frequencies;

evaluating n–1 capacitive time constants by numerically combining values of n–1 of said 2n intermediate variables;

evaluating an inductive time constant by numerically combining values of said n–1 capacitive time constants and values of two of said 2n intermediate variables;

evaluating a resistance of said single R-L subcircuit and n–1 resistances of said n–1 R-C subcircuits by numerically combining values of said n–1 capacitive time constants, the value of said inductive time constant, and values of n of said 2n intermediate variables; and, evaluating an inductance of said R-L subcircuit and n–1 capacitances of said n–1 R-C subcircuits by numerically combining a resistance value for each said subcircuit with a corresponding time constant value associated with the same said subcircuit.

13. A method as in claim 12 wherein n is equal to three.

14. A method for determining element values of an equivalent circuit model of an electrochemical cell or battery, said model comprising a series interconnection of a single two-element series R-L subcircuit and n–1 two-element parallel R-C subcircuits where n is an integer equal to or greater than two, said method comprising the steps of:

measuring real and imaginary parts of complex immittance of said electrochemical cell or battery at n discrete frequencies where one of said n discrete frequencies is a high frequency;

evaluating a resistance and an inductance of said R-L subcircuit by numerically combining the value of said high frequency and values of said real and imaginary parts of said complex immittance at said high frequency;

evaluating a difference impedance at each of n–1 remaining frequencies by numerically combining values of said resistance, said inductance, and said remaining frequency, with the value of said complex immittance at each said remaining frequency;

evaluating 2n–2 intermediate variables by numerically combining values of said n–1 remaining frequencies and values of real and imaginary parts of said difference impedance at said n–1 remaining frequencies;

evaluating n–1 capacitive time constants of said n–1 R-C subcircuits by numerically combining values of n–1 of said 2n–2 intermediate variables;

evaluating n–1 resistances of said n–1 R-C subcircuits by numerically combining values of said n–1 capacitive time constants and values of n–1 of said 2n–2 intermediate variables; and, evaluating n–1 capacitances of said n–1 R-C subcircuits by numerically combining a resistance value of each said subcircuit with a corresponding capacitive time constant value of the same said subcircuit.

15. A method as in claim 14 wherein n is equal to three.

16. A method for determining electrical, chemical, or physical properties of an electrochemical cell or battery comprising the steps of:

measuring real and imaginary parts of complex immittance of said electrochemical cell or battery at n discrete frequencies where n is an integer number equal to or greater than two and one of said discrete frequencies is a high frequency;

evaluating a first resistance and an inductance by numerically combining the value of said high frequency and values of said real and imaginary parts of said complex immittance at said high frequency;

evaluating a difference impedance at each of n–1 remaining frequencies by numerically combining values of said first resistance, said inductance, and said remaining frequency with the value of said complex immittance at each of said n–1 remaining frequencies;

evaluating 2n–2 intermediate variables by numerically combining values of said n–1 remaining frequencies and values of real and imaginary parts of said difference impedance at said n–1 remaining frequencies;

evaluating n–1 time constants by numerically combining values of n–1 of said 2n–2 intermediate variables;

evaluating n–1 second resistances by numerically combining values of said n–1 time constants and values of n–1 of said 2n–2 intermediate variables;

evaluating n–1 capacitances by numerically combining the value of each of said n–1 second resistances with a corresponding value of each of said n–1 time constants; and, relating values of one or more of said first resistance, said n–1 second resistances, said inductance, and said n–1 capacitances to said electrical, chemical, or physical property of said electrochemical cell or battery.

17. A method as in claim 16 wherein n is equal to three.

18. A device for determining an electrical chemical, or physical property of an electrochemical cell or battery adapted to perform the steps of the method of claim 10.

19. A device for determining element values of an equivalent circuit model for an electrochemical cell or battery, said model comprising a series interconnection of single two-element series R-L subcircuit and n–1 two-element parallel R-C subcircuits where n is an integer number equal to or greater than two, said device adapted to perform the steps of:

measuring real and imaginary parts of complex immittance of said electrochemical cell or battery at n discrete frequencies;

evaluating 2n intermediate variables by numerically combining values of said n discrete frequencies and values of said real and imaginary parts of said complex immittance at said n discrete frequencies;

evaluating n−1 capacitive time constants by numerically combining values of n−1 of said 2n intermediate variables;

evaluating an inductive time constant by numerically combining values of said n−1 capacitive time constants and values of two of said 2n intermediate variables;

evaluating a resistance of said single R-L subcircuit and n−1 resistances of said n−1 R-C subcircuits by numerically combining values of said n−1 capacitive time constants, the value of said inductive time constant, and values of n of said 2n intermediate variables; and, evaluating an inductance of said R-L subcircuit and n−1 capacitances of said n−1 R-C subcircuits by numerically combining a resistance value for each said subcircuit with a corresponding time constant value associated with the same said subcircuit.

20. A device for determining element values of an equivalent circuit model of an electrochemical cell or battery, said model comprising a series interconnection of single two-element series R-L subcircuit and n−1 two-element parallel R-C subcircuits where n is an integer number equal to or greater than two, said device adapted to perform the steps of:

measuring real and imaginary parts of complex immittance of said electrochemical cell or battery at n discrete frequencies where one of said n discrete frequencies is a high frequency;

evaluating a resistance and an inductance of said R-L subcircuit by numerically combining the value of said high frequency and values of said real and imaginary parts of said complex immittance at said high frequency;

evaluating a difference impedance at each of n−1 remaining frequencies by numerically combining values of said resistance, said inductance, and said remaining frequency, with the value of said complex immittance at each said remaining frequency;

evaluating 2n−2 intermediate variables by numerically combining values of said n−1 remaining frequencies and values of real and imaginary parts of said difference impedance at said n−1 remaining frequencies;

evaluating n−1 capacitive time constants of said n−1 R-C subcircuits by numerically combining values of n−1 of said 2n−2 intermediate variables;

evaluating n−1 resistances of said n−1 R-C subcircuits by numerically combining values of said n−1 capacitive time constants and values of n−1 of said 2n−2 intermediate variables; and, evaluating n−1 capacitances of said n−1 R-C subcircuits by numerically combining a resistance value of each said subcircuit with a corresponding capacitive time constant value of the same said subcircuit.

21. A device for determining an electrical, chemical, or physical property of an electrochemical cell or battery adapted to perform the steps of:

measuring real and imaginary parts of complex immittance of said electrochemical cell or battery at n discrete frequencies where n is an integer number equal to or greater than two and one of said discrete frequencies is a high frequency;

evaluating a first resistance and an inductance by numerically combining the value of said high frequency and values of said real and imaginary parts of said complex immittance at said high frequency;

evaluating a difference impedance at each of n−1 remaining frequencies by numerically combining values of said first resistance, said inductance, and said remaining frequency with the value of said complex immittance at each of said n−1 remaining frequencies;

evaluating 2n−2 intermediate variables by numerically combining values of said n−1 remaining frequencies and values of real and imaginary parts of said difference impedance at said n−1 remaining frequencies;

evaluating n−1 time constants by numerically combining values of n−1 of said 2n−2 intermediate variables;

evaluating n−1 second resistances by numerically combining values of said n−1 time constants and values of n−1 of said 2n−2 intermediate variables;

evaluating n−1 capacitances by numerically combining the value of each of said n−1 second resistances with a corresponding value of each of said n−1 time constants; and, relating values of one or more of said first resistance, said n−1 second resistances, said inductance, and said n−1 capacitances to said electrical, chemical, or physical property of said electrochemical cell or battery.

* * * * *